(12) United States Patent
Klosner et al.

(10) Patent No.: US 7,164,465 B2
(45) Date of Patent: Jan. 16, 2007

(54) VERSATILE MASKLESS LITHOGRAPHY SYSTEM WITH MULTIPLE RESOLUTIONS

(75) Inventors: Marc A. Klosner, White Plains, NY (US); Kanti Jain, Hawthorne, NY (US)

(73) Assignee: Anvik Corporation, Hawthorne, NY (US)

( * ) Notice: Subject to any disclaimer, the term of this patent is extended or adjusted under 35 U.S.C. 154(b) by 230 days.

(21) Appl. No.: 10/890,498

(22) Filed: Jul. 13, 2004

(65) Prior Publication Data

US 2006/0012766 A1      Jan. 19, 2006

(51) Int. Cl.
*G03B 27/54*   (2006.01)
*G03B 27/42*   (2006.01)
*G03B 27/32*   (2006.01)

(52) U.S. Cl. .............................. 355/67; 355/53; 355/77

(58) Field of Classification Search .................. 355/67, 355/46, 53, 77; 359/11, 201, 237; 430/394; 399/148
See application file for complete search history.

*Primary Examiner*—Rodney Fuller
*Assistant Examiner*—Kevin Gutierrez
(74) *Attorney, Agent, or Firm*—Carl C. Kling

(57) ABSTRACT

A versatile maskless patterning system with capability for selecting rapidly among a plurality of projection lenses mounted on a turret. This provides the ability to rapidly select multiple choices for resolution and enables optimization of the combination of the imaging resolution and exposure throughput, making possible cost-effective fabrication of microelectronics packaging products. A preferred embodiment uses a digital micromirror device array spatial light modulator as a virtual mask. Another preferred embodiment use multiple closely spaced digital micromirror device array spatial light modulators to enhance throughput.

18 Claims, 6 Drawing Sheets

VERSATILE MASKLESS LITHOGRAPHY SYSTEM WITH MULTIPLE RESOLUTIONS

BACKGROUND OF THE INVENTION (1) Field of the Invention

This invention relates to a versatile maskless patterning system with capability for: selecting rapidly among a plurality of projection lenses, providing multiple resolutions, enabling optimization of the combination of the imaging resolution and exposure throughput, and making possible cost-effective fabrication of microelectronics packaging products.

(2) Description of Related Art

Microelectronic packaging technology is a key driver leading to advancements in the performance of electronic systems that are integrated on circuit boards. Especially for high-processing-power systems, the packages may be the most crucial factor since they gate the rate of communication between different chips, and in fact, a high-end processor may be only as good as the packages that are used to interface it with the other components on the board. Additionally, given the importance of portability for commercial, but especially for all types of military systems, the size of the package is important as well. Recent trends in packaging technology have resulted in small, high-performance packages by means of designs having fine linewidths, multi-level circuitry, and solder-bump interfaces to the circuit board. Fabrication of packages having these advanced design features can be performed only with high-resolution patterning systems that have fine-alignment capability—resolutions down to 10 µm and alignment capability better than 3 µm are required for next-generation microelectronic packages.

While microelectronics packages have traditionally been fabricated by means of conventional lithography tools such as contact printers, the requirements for higher resolution and finer alignment for the multiple layers of the package have led to the need for a mix-and-match approach, based on contact printing, proximity printing, direct-write, as well as projection lithography. The large-area seamless-scanning projection lithography systems developed by Anvik Corporation (U.S. Pat. Nos. 4,924,257 and 5,285,236) meet both the resolution and alignment requirements for next-generation microelectronic packages—and deliver high throughputs—and are therefore highly attractive for large-volume production of high-end packages.

A massively parallel maskless lithography technology newly developed by Anvik (U.S. Pat. No. 6,312,134) has promising applications for the production of a wide variety of electronic systems, that require only small-to-moderate-volume production of many specialized components, rather than a large volume of a single component; for example, for military missile defense applications, which require large networks of sensor, communication, and networking equipment, but in limited quantities.

Anvik's prior-art maskless lithography system uses a spatial light modulator (SLM) array instead of a Mylar or glass mask. The SLM is a megapixel display device which can be updated at multi-kHz frame rates. The SLM fully removes the need for hard glass masks, eliminating many of the problems associated with the use of masks, including the cost of purchasing and maintaining masks; the cost of lost yield resulting from masks having defects; and the production time that is lost while waiting for delivery of masks from mask houses. These factors can be particularly significant for electronic components manufactured in low volumes, such as many military electronics, where mask-related issues may be the primary influences affecting the price and delivery of the component.

In spite of the above cited advantages of the prior art maskless lithography technology, there is still a need for a more versatile maskless patterning system where the demagnification of the SLM image onto the substrate can be rapidly and easily varied in order to optimize the trade-off between pattern definition and throughput. Such a versatile system would be capable of patterning a large range of feature sizes on a wide variety of substrate materials, over very large areas, the substrate size limited only by the travel range of the scanning stage. In addition, it would be capable of patterning different regions on the same substrate with different resolution and feature sizes.

BRIEF SUMMARY OF THE INVENTION

This invention provides a capability for selecting rapidly among a plurality of projection lenses in a maskless patterning system, providing multiple choices for resolution and feature size, and enabling optimization of the combination of the imaging resolution and exposure throughput.

An object of this invention is to enable the cost-effective fabrication of microelectronic packaging products.

Another object of this invention is to provide versatility to a single maskless patterning system.

A feature of this invention is the use of a plurality of projection lenses of different demagnifications mounted on a turret in such a way that they can be rapidly and easily interchanged while maintaining alignment and focus.

Another feature of this invention is the use of multiple spatial light modulators to provide a composite image with a greatly enhance pixel count for demagnification by the selected projection lens.

Another feature of this invention the use of software that recognizes those high detail areas of the virtual mask that require small feature size and that controls the projection lens turret and scanning stage in such a way that these high detail areas are patterned with the necessary high resolution while allowing the other areas to be patterned more rapidly at lower resolution.

An advantage of this invention is that a single versatile system is capable of patterning a large range of feature sizes on a wide variety of substrate materials, over very large areas, with the substrate size limited only by the travel range of the scanning stage.

Another advantage of this invention is that selection of the projection lens and illumination source can be accomplished easily and rapidly so that system down time between production runs or steps in production runs is minimized.

Another advantage of this invention is that a single versatile system is capable of patterning the different layers involved for each of the process steps in the multi-step fabrication of microelectronic packaging products, with the optimum combination of resolution and exposure throughput for each step.

Another advantage of this invention is that patterning different regions on the same substrate with different resolution and feature size can be accomplished, making it possible to increase overall throughput by using the highest resolutions only on those regions of the substrate where the smallest feature sizes are needed.

Another advantage of this invention is that the patterning of the various areas on the substrate with different feature size can be accomplished either sequentially or simultaneously or any combination thereof, making it possible to further improve throughput.

Another advantage of this invention is that the virtual mask for each layer of the microelectronic packaging product to be manufactured can be designed in such a way that the features requiring the highest resolution are deliberately located on specific limited regions of the substrate, making it possible to further improve throughput by taking fuller advantage of the ability to use the highest resolutions only on those regions of the substrate where the smallest feature sizes are located.

Other objects, features, and advantages of the invention will be apparent from the following written description, claims, abstract, and the annexed drawings.

DETAILED DESCRIPTION OF THE INVENTION

Figure 1:
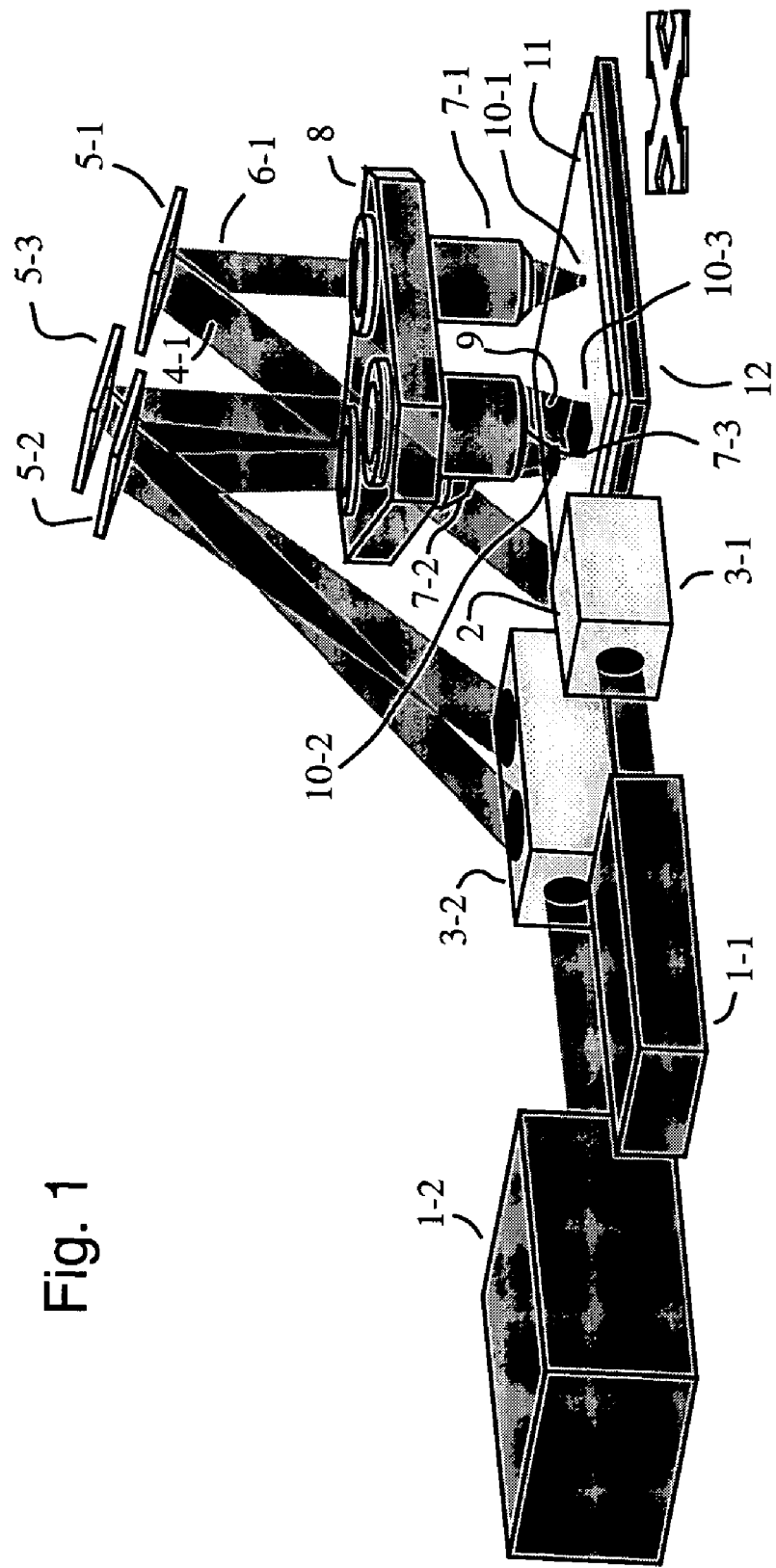
FIG. 1 is an overview of the versatile maskless patterning system, showing the illumination sources, the spatial light modulators, the substrate mounted on a planar scanning stage, and a plurality of projection lenses.

FIG. 1 shows an overview of the versatile maskless patterning system. Radiation is provided by collimated light sources 1-1 and 1-2, which could be excimer lasers or other types of pulsed laser source. The beams of light 2-1 and 2-2 are directed through an illumination systems 3-1 and 3-2 that transform and split the non-uniform output beams of the lasers into a highly uniform beams 4-1, 4-2 and 4-3 that are shaped to match the entrance apertures of spatial light modulators (SLMs) 5-1, 5-2, and 5-3. SLMs 5 could be a digital micromirror device (DMD) arrays used in reflection or it could be a liquid crystal light valves used in transmission. The spatially modulated beams 6-1, 6-2, and 6-3 of light emerging from SLMs 5 is then directed through projection lenses 7-1, 7-2, and 7-3 mounted on lens mount 8 to form a focused beams 9-1, 9-2, and 9-3 that form demagnified images 10-1, 10-2, and 10-3 on substrate 11. Substrate 11 is mounted on planar scanning stage 12 that is capable of high-precision two-dimensional scanning in the plane perpendicular to the axis of beams 9.

Operation of the maskless patterning system is achieved by scanning stage 12 while each of the SLMs 5 displays a sequence of frames—each frame representing a portion of an entire printed pattern—mimicking a prior art hard mask scanning synchronously with the substrate. The illumination of each SLM 5 is provided by pulsed laser sources 1 and the illumination pulses are synchronized to the data stream that configures the SLMs. Pixels which are "on" in each SLM reflect the illumination into the aperture of the corresponding projection lens and are therefore imaged onto the substrate; "off" pixels reflect illumination away from the lens and therefore are not imaged.

An important feature of the versatile maskless patterning system is the use of a plurality of projection lenses 7 mounted in lens mount 8, which can be fixed or movable. Each projection lens has a different demagnification ratio and is mounted in lens mount 8 in such a way that it is precisely in focus with the plane of the substrate 11 and in accurate registration with the patterning location. Each lens is of a different magnification, the function of which is to provide multiple resolutions and enable optimization of the combination of the imaging resolution and exposure throughput. In one preferred embodiment, there are three lenses 7 in lens mount 8 covering a range from 1 to 14× demagnification. Sequential, simultaneous or any combination thereof exposures of the substrate to patterning projected beams with different selected resolutions is achieved by controlling selected SLMs 5 and laser sources 1. Any of the projected beams 9 can be turned off entirely by adjusted all of the pixels in the corresponding SLM 5 to the "off" position.

In simplified embodiments of the versatile maskless patterning system, a single illumination source 7 is used with a single SLM 5. A plurality of projection lenses 7-1 . . . 7-n is mounted in movable lens mount 8. The projection lens 7 can be arranged in a linear array, in a 2-D array, or along the circumference of a circle. Movable lens mount 8 which can be translated or rotated. Each projection lens 7 has a different demagnification ratio and is mounted in lens mount 8 in such a way that translation or rotation of the mount selects a particular projection lens and demagnification ratio. The lenses are mounted and pre-aligned in mount 8 so that when any lens is brought into imaging position it is precisely in focus with the plane of the substrate 11 and in accurate registration with the patterning location. Each lens is of a different demagnification, the function of which is to provide multiple resolutions and enable optimization of the combination of the imaging resolution and exposure throughput. In one preferred embodiment, there are three lenses 7 in lens mount 8 that can be rotated to cover a range from 1 to 14× demagnification.

Figure 2:
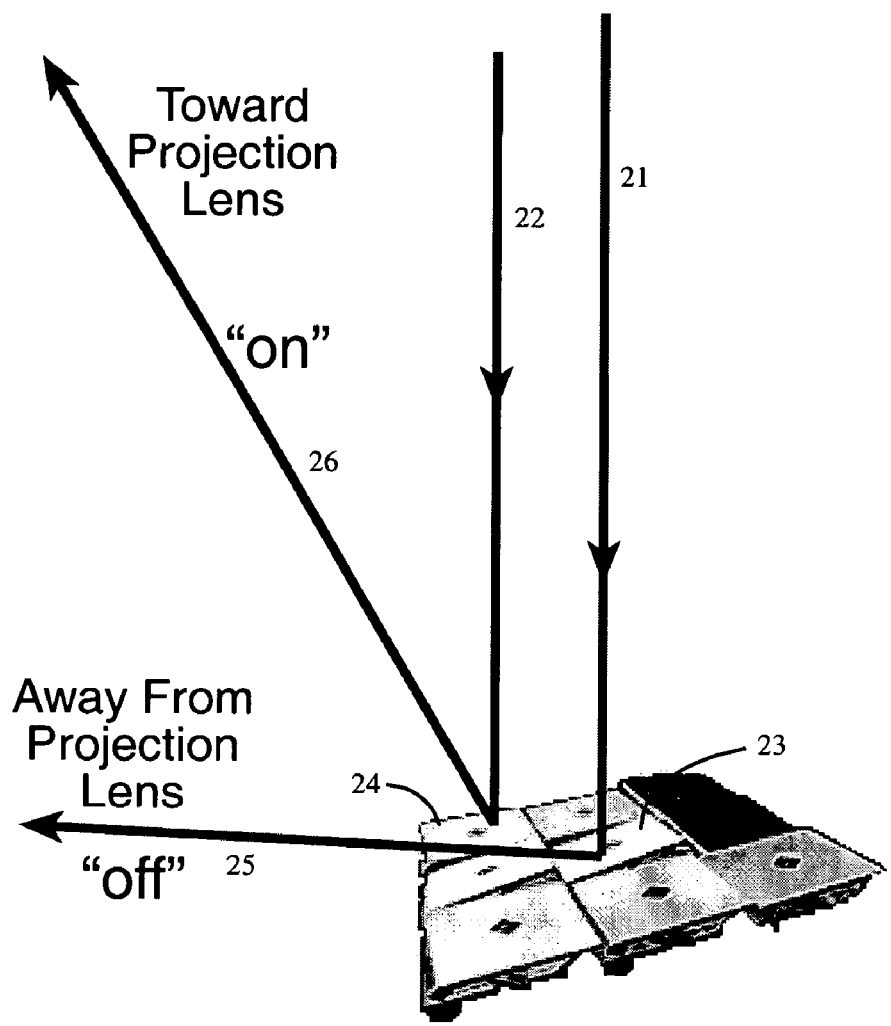
FIG. 2 shows the operation of a digital micromirror device array type spatial light modulator as a virtual mask.

FIG. 2 shows the operation of a DMD type SLM as a virtual mask. Illumination rays 21 and 22 are incident on different pixels, 23 and 24, respectively, of the micromirror array. Pixel 23 is oriented in the "off" direction and hence reflected ray 25 misses the collection aperture of the projection lens. Pixel 24 is oriented in the "on" direction and hence reflected ray 26 is collected by the projection lens.

In one preferred embodiment, a DMD array with 1024× 768 micro-pixel array is used having a pixel pitch of 14 μm. A DMD of this type is compatible with reasonable levels of fluence in the visible through the ultraviolet wavelength range, with a damage threshold of 100 mJ/cm$^2$ (comparable to the damage thresholds for chrome masks in prior art lithography), and an average power rating of 10 W/cm$^2$.

Figure 3:
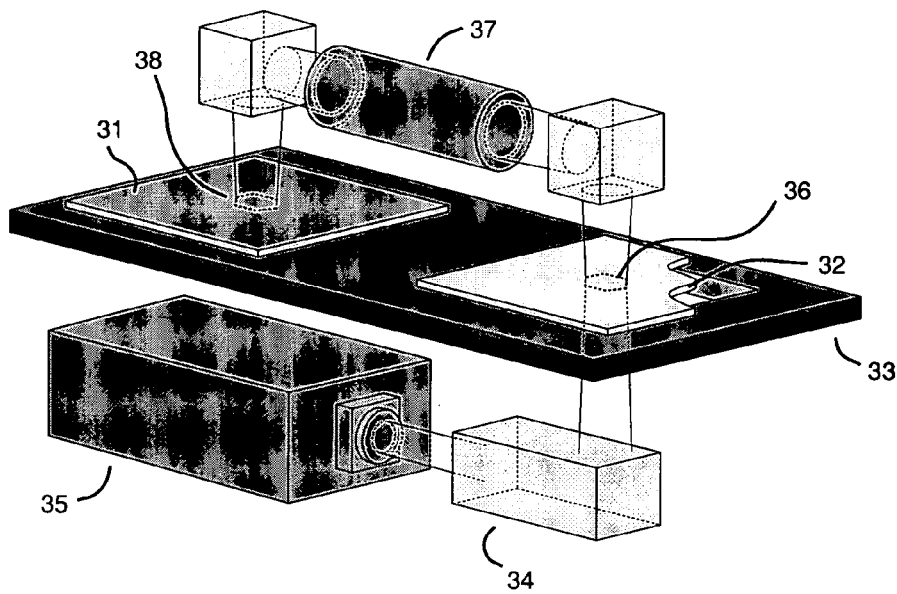
FIG. 3 shows a schematic of a prior art large-area, high throughput patterning system that uses a conventional glass mask.

FIG. 3 shows a schematic of a prior art large-area, high throughput patterning system developed by Anvik Corporation. The substrate 31 and the mask 32 are mounted on a single planar stage 33, which moves them together in both x- and y-directions. The illumination system 34 utilizes an excimer laser source 35 that is coupled to optical elements in illumination system 34 which transform the non-uniform rectangular output beam of the laser into a highly uniform hexagonally-shaped beam that illuminates the mask with a hexagonally shaped illumination field 36. A 1:1 projection lens 37 images the portion of the pattern that lies within the illuminated hexagonal region on the mask, on to substrate 31 to form image 38. The projection lens has an image field of 10–50 mm in diameter, depending on the resolution of the projection lens.

Figure 4:
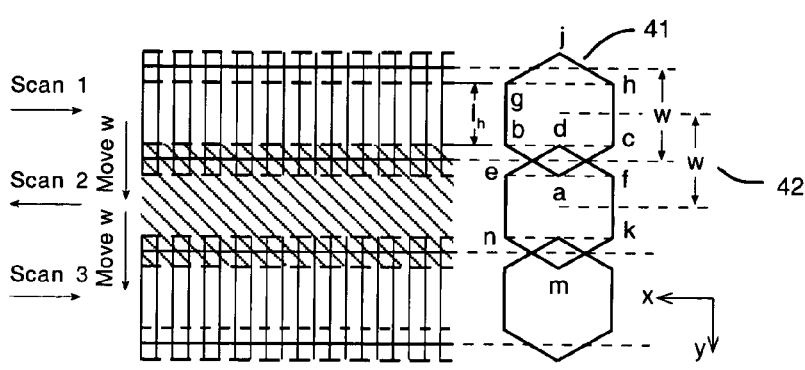
FIG. 4 illustrates the seamless overlapping of the images projected onto the substrate as the planar stage moves the mask and substrate in unison in an x-y raster pattern.

FIG. 4 shows the seamless overlapping of the images 41 on the substrate as (see FIG. 3) the single planar stage 38 moves the mask 32 and the substrate 31 in unison along an arbitrary direction defined for purposes of illustration as the x-axis, while scanning the mask through the hexagonal illumination region. Following a scan, the stage moves along the orthogonal direction (y-axis) by the effective scan width 42, denoted by symbol w. The substrate and mask are then again scanned along the x-axis as before, after which they are stepped along the y-axis, and the process is repeated until the entire substrate is exposed. The complementary overlap between adjacent scans is such that the transition from one scan to the next is totally seamless and free from any exposure nonuniformity. Anvik Corporation has manufactured systems achieving resolutions as low as 1 μm and has built alignment systems that can achieve sub-micron registration.

Figure 5:
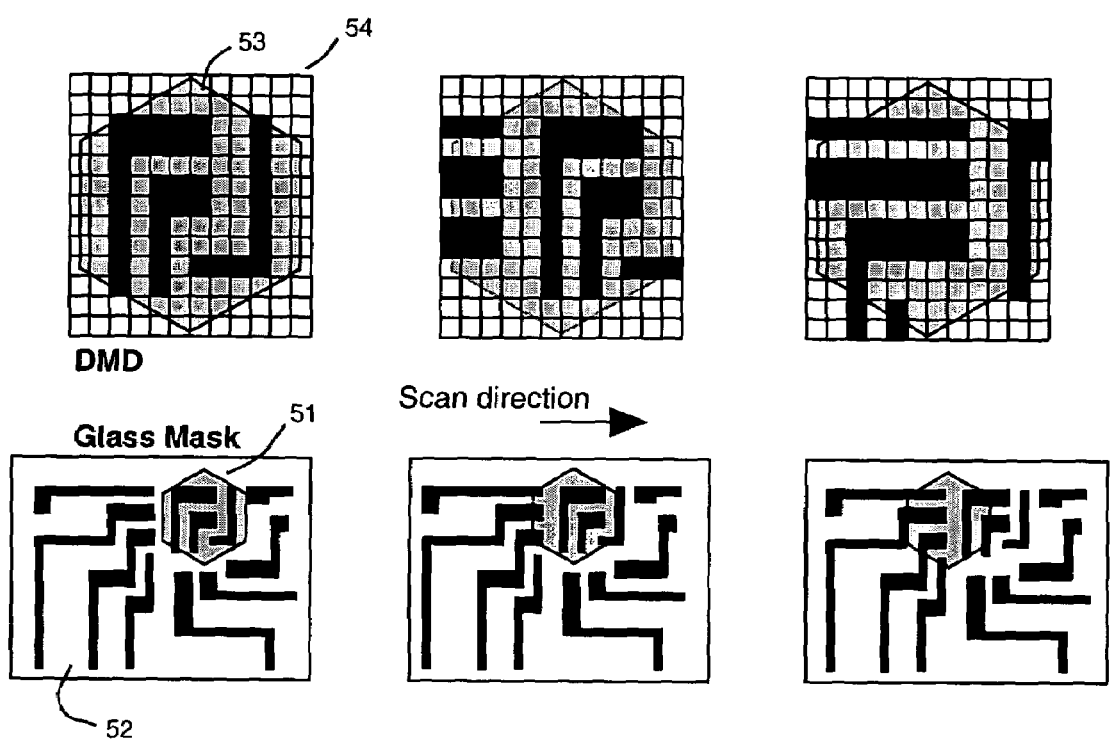
FIG. 5 shows a comparison of the operation of the maskless patterning systems with the prior art seamless scanning lithography using a conventional glass mask.

FIG. 5 shows a comparison of operation of the maskless patterning system described in FIG. 1 and FIG. 2 with the prior art seamless scanning lithography using a conventional glass mask described in FIG. 3 and FIG. 4. The operation is shown for three consecutive illumination pulses. With the glass mask, the hexagonal illumination beam 51 remains stationary in space, while the mask 52 is scanned through the illuminated region. With the DMD spatial light modulator, the hexagonal illumination beam 53 also remains stationary in space as does the physical location of the DMD array 54. But the pattern of "off" and "on" pixels displayed by the DMD is rapidly altered and advanced by a fixed number of pixels for each successive pulse, so as to correspond to the desired feature geometry at a particular location of the substrate.

Since the substrate rests on a stage which moves at a constant velocity, each pulse that illuminates the DMD spatial light modulator, exposing the substrate, illuminates a different region of the substrate. The system therefore operates such that entire DMD array is reconfigured for each pulse, mimicking a scanning mask. Since the substrate scans at a constant velocity, while the DMD spatial light modulator remains stationary, image blurring results due to the finite duration of the illumination pulse, and therefore the pulse width must be short enough to maintain the blurring below a maximum-acceptable level, which we typically set at less than $\frac{1}{5}^{th}$ the minimum feature size. In order to optimize throughput, the system should operate at the fastest possible pattern transfer rate, limited either by the frame rate of the DMD or the maximum repetition rate of the laser.

In a preferred embodiment, the translation speed of the stage is set to a value where, between consecutive laser pulses, the substrate moves a distance that is only a fraction of the width of the hexagonal illumination beam. Each point on the substrate is thus illuminated by a number of different pulses as the stage carries the substrate through the illuminated region, thereby integrating the energy along the scan direction and improving the uniformity of the delivered dose along that axis.

Figure 6:
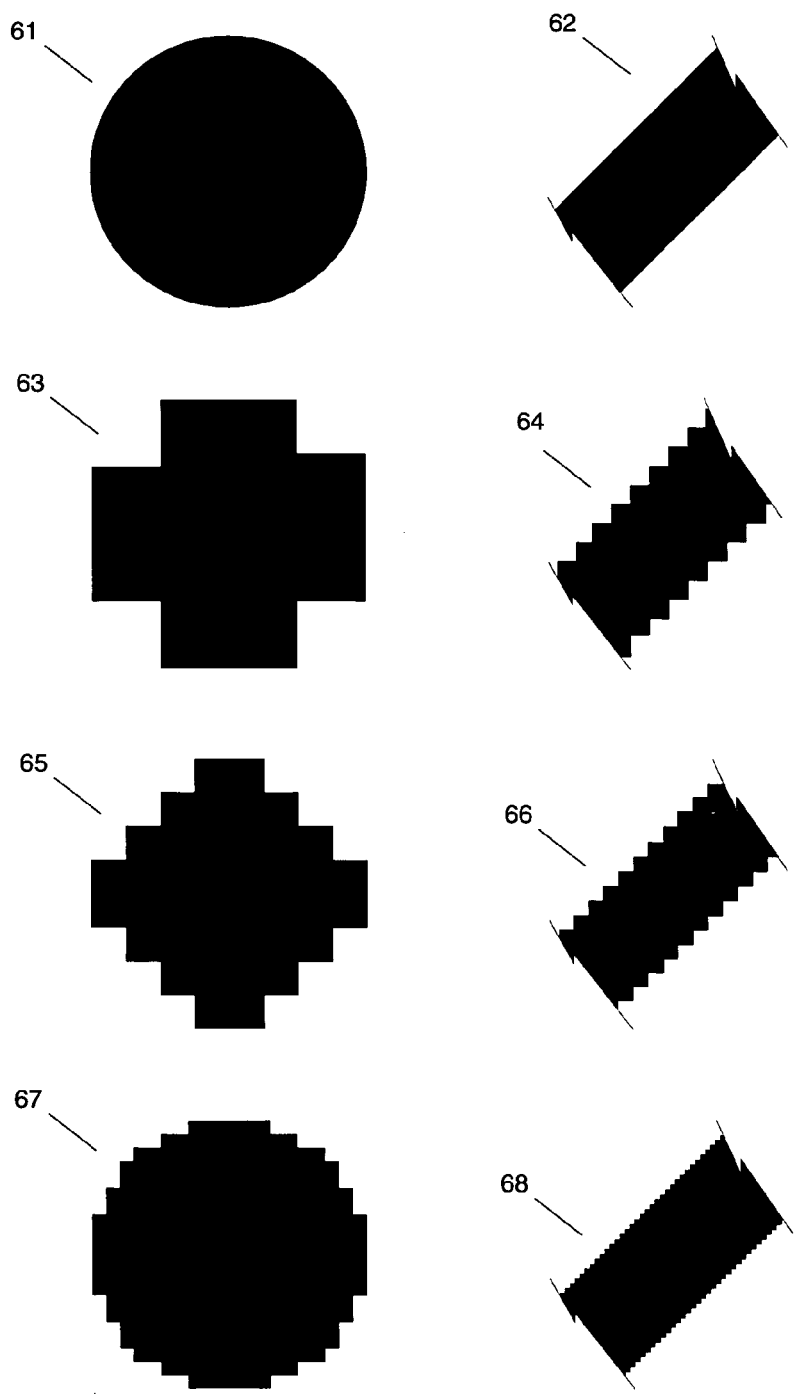
FIG. 6 shows features that can be written with various ratios of address size to feature size.

FIG. 6 shows features that can be written with various ratios of address size to feature size. The 'address size' is the smallest x-y separation of points on the x-y grid used to define a digitized feature in the mask writing process. An ideal circle 61 and ideal tilted line 62 are shown in the top row. The next row down shows the circle 63 and tilted line 64 written with an address size of $\frac{1}{5}^{th}$ of the feature size. The next row below that shows the circle 65 and tilted line 66 written with an address size of $\frac{1}{7}^{th}$ of the feature size. The bottom row shows the circle 67 and tilted line 68 that can be written with an address size of $\frac{1}{20}^{th}$ of the feature size.

The 'address size', is an important parameter for both mask-based and maskless systems. For example, with a mask-based system, a mask is written either with a laser or an e-beam tool, using pattern data produced on a CAD program. Curved features, such as circles, are continuous, smooth patterns, when created on a CAD program, but when they are digitized for mask writing, the smooth curves must be approximated by a step-wise pattern constrained to locations on an x-y grid. The 'address size' is the smallest x-y separation of points on the grid. As shown in FIG. 6, a curved feature patterned with an address size that is small compared with the feature size, closely approximates the actual curved feature, but as the address size becomes comparable with the feature size, the patterned feature takes on a block-like appearance. Similarly for line features that run on a skewed angle with respect to the x-y grid. Chrome masks, for example, generally use an address size that is approximately $\frac{1}{20}^{th}$ the size of the smallest feature that is written on the mask.

The maskless lithography system also has an address size, in this case the pitch of the x-y pixel array in the image plane. For a preferred embodiment of the versatile maskless system, designed for 10 μm resolution, the address sizes is as small as 1 μm—which is $\frac{1}{10}$th the size of the smallest feature—so that feature definition will compare favorably with that obtained with hard masks.

Since the size of the pixels on the spatial light modulator is fixed, the address size can only be changed by varying the magnification of the projection lens. For a preferred embodiment of the versatile maskless patterning system, a DMD type spatial light modulator is used with a fixed pixel size of approximately 14 μm. Thus when patterning features several hundred microns in dimension, 1:1 imaging is suitable, since the pixel size is substantially smaller than $\frac{1}{10}$th the feature size. However, for the finest curved and off-grid features of sizes down to 10 μm, as required for high-performance electronic packages, a reduction ratio of approximately 14:1 would be needed in order to have an address size $\frac{1}{10}$th the size of the features. For features of the order of many tens of microns to >100 μm, intermediate address sizes would be needed. For this preferred embodiment of the versatile maskless patterning system, three different projection lenses are used, each covering a different magnification range.

Figure 7:
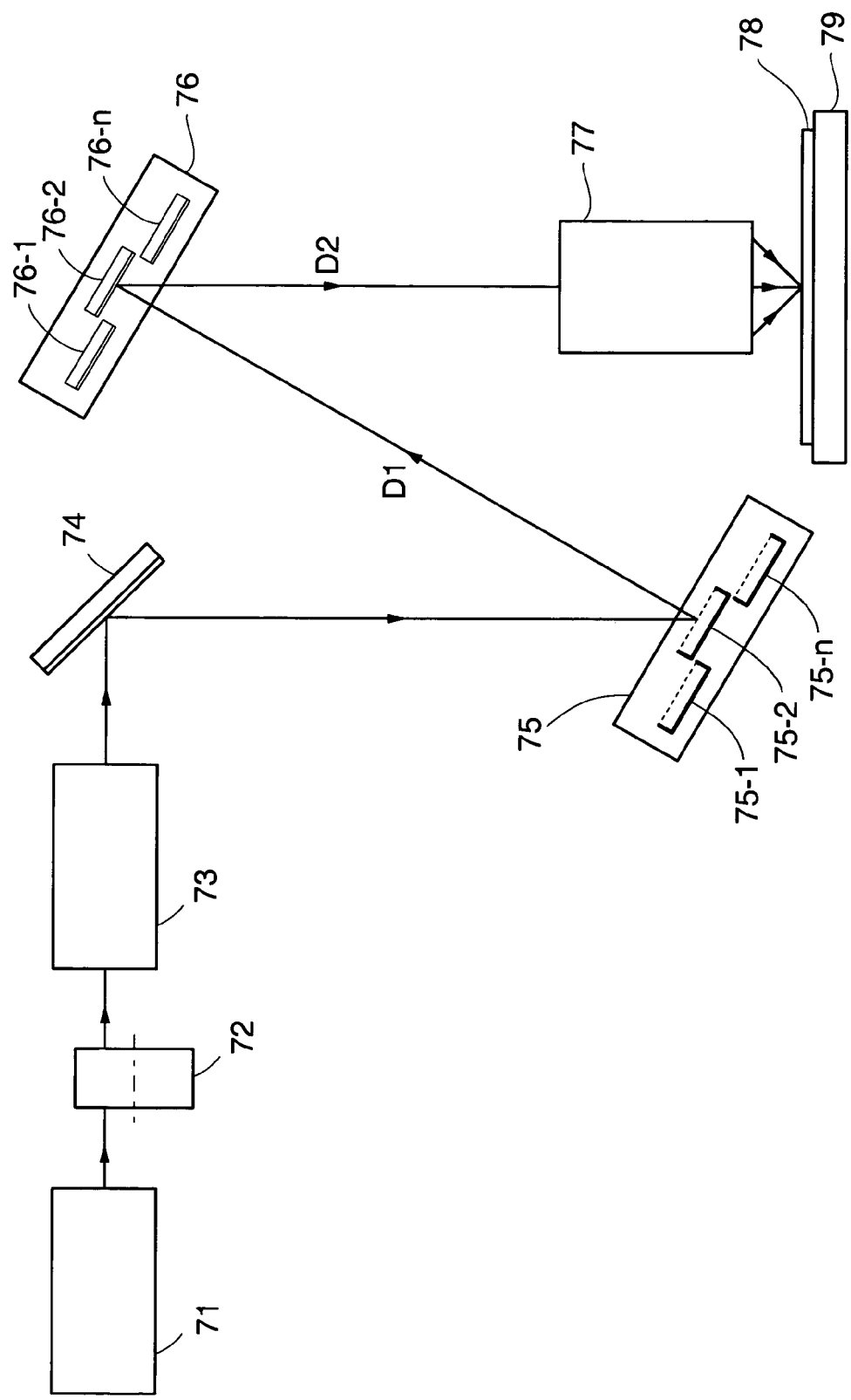
FIG. 7 is an overview of an improved version of the maskless patterning system using multiple closely spaced spatial light modulators to enhance throughput.

FIG. 7 shows an improved version of the versatile maskless patterning system using multiple closely spaced spatial light modulators to enhance throughput. In a preferred embodiment, DMD type spatial light modulators are used. Light from illumination source 71 is passed thorough beam forming optics 72 and homogenizing optics 73 to impinge on mirror 74 that directs the beam to compound spatial light modulator 75. Compound spatial light modulator 75 consists of a multiplicity of closely spaced spatial DMD chips 75-1 through 75-*n* that are arranged in a staggered and overlapping pattern to minimize the "dead area" presented to the beam of light by the edge region of the DMD chips that contains electronics but no DMD devices. The "on-position" light is reflected to impinge on segmented mirror 76. Segmented mirror 76 consists of a multiplicity of mirror segments 76-1 through 76-*n* that are in one to one correspondence with each of the DMD chips 75-1 through 75-*n*. The light is reflected by segmented mirror 76 to pass through projection lens 77 and impinge on substrate 78 mounted on scanning stage 79. The mirror segments 76-1 through 76-*n* are arranged in a staggered and overlapping pattern that is complementary to the pattern of DMD chips 75-1 through 75-*n*, making the optical path length from each of the DMD chips 75-1 through 75-*n* to the projection lens 77 equal. This ensures that the projected images of all of the DMD chips 75-1 through 75-*n* are exactly in focus on the plane of the substrate 78.

General Considerations Regarding Throughput

For microelectronic packaging products, conductor traces, layer-to-layer vias, and other features may range in size from as small as 10 µm and as large as several hundred microns. Vias for ball grid arrays, which connect the chip package to the circuit board, are generally several hundred microns in size. Thus the versatile maskless system for fabricating microelectronic packages should be capable of efficiently patterning features over a wide range of sizes, from approximately 10 microns, up to several-hundred microns, while delivering optimum throughput for the full range of feature sizes.

While a 14:1 reduction system would satisfy the address size requirements over the full range of resolutions, from 10 µm up to several hundred microns, the large reduction ratio has the disadvantage that, from optical design considerations, it leads to a smaller field size compared with a 1:1 system. For example, the image area for the larger reduction ratio is approximately 200 times smaller, a factor large enough to have a significant effect on the throughput of the maskless tool. Therefore, to optimize throughput, it is desirable to operate at the largest acceptable address size. In order to meet this requirement, the preferred embodiment of the versatile maskless patterning system uses three different lenses, each producing different address sizes by covering different demagnification ranges.

For the coarsest features, of the order of hundreds of microns, a reduction lens operating at demagnification ratios ranging from 1:1–2:1 (providing a pixel image size of 14–7 µm) is required. For intermediate resolutions, a lens covering a range from 2:1–4:1 (providing a pixel image size of 7–3.5 µm) is required; and for the finest features, of the order of tens of microns, a lens ranging from 4:1–14:1 (providing a pixel image size of 3.5–1 µm) is required. Having three projection lenses covering this full range, rather than a single lens, is preferable because it would reduce the overall complexity of the imaging system given that the design and construction of three individual lenses, each covering a small magnification range, is much simpler than the design and construction of a single lens covering the full magnification range. For example, the highest-reduction lens, operating for feature sizes from 1–3.5 µm, would need a field size of only 4 mm for 3.5 µm resolution and 1.5 mm for 1 µm resolution, comparable to the specifications of a standard microscope objective. The low reduction-ratio lens would operate at a field size of approximately 1 cm for 14 µm resolution, and 0.5 cm at 7 µm resolution, performance specifications that are only slightly more demanding than those of a high-quality camera lens.

In order to optimize the throughput at various reduction ratios, it is sometimes advantageous to use several different illumination sources, each one for a particular reduction ratio range. This is because a change in the projection lens reduction ratio causes a quadratic change in the exposure pulse intensity on the substrate. In a preferred embodiment of the versatile maskless patterning system, two different laser sources are utilized.

For patterning the coarser features by using the projection lens operating in the range of 1:1–2:1 reduction, a XeF excimer laser source is used. This laser has an output wavelength of 351 nm, compatible with i-line resists and operates at 1000 Hz, producing around 25 mJ/pulse. In this operating regime the image field size ranges from approximately 0.25 to 1 $cm^2$ in the image plane, and, therefore, assuming a typical 50% optical system throughput, the exposure intensity ranges from 12 to 50 mJ/$cm^2$ per pulse in the image plane. While the repetition rate of the laser source is significantly lower than the 10 kHz frame rate of the DMD, the full utilization of the output power from the laser results in a high-throughput system.

However, if operating at 14:1 demagnification with the same excimer laser, the energy density in the image plane would range from 2 to 8 J/$cm^2$ per pulse, which is far more than needed, considering that typical resists have a dosage requirement of, at most, several-hundred mJ/cm2. Consequently the laser would have to be operated at much lower power than its peak capability, significantly reducing the throughput. A better choice is a high-power solid-state laser system, operating at lower power per pulse, but much higher repetition rate, such as a frequency-quadrupled Nd:YLF laser with output at 351 nm, producing 5 W of power at a repetition rate of 10 kHz. At 0.5 mJ/pulse output from such a laser, with 50% optical system efficiency, operating with 14× reduction, the energy density in the image plane is approximately 50 mJ/$cm^2$, comparable to that obtained at 1:1 magnification with an excimer laser source, and suitable for exposing a variety of resists. For magnifications in the middle of the range, around 4–10×, the system offers the user the flexibility to choose the light source that optimizes the throughput.

TABLE 1 summarizes the operating conditions for various patterned feature sizes.

| Feature Size | Imaging Lens | Illumination Source |
| --- | --- | --- |
| 150–250 µm | 1X–2X reduction | XeF Excimer |
| 75–150 µm | 2X–4X reduction | Nd:YLF, XeF Excimer |
| 20–75 µm | 4X–14X reduction | Nd:YLF |

Thus the preferred embodiment of the versatile maskless patterning system is designed to optimize performance by allowing the user to obtain the best feature definition without sacrificing patterning speed. Following are some specific calculations of throughputs.

The throughput estimates are for patterning resists having a relatively high dosage requirement of 200 mJ/$cm^2$. For purposes of achieving uniform exposure at all pixel sites on the substrate, each pixel with is assumed to be exposed to twenty pulses. Therefore, the laser intensity would be decreased to levels below the maximum possible output in order to achieve an energy density of 10 mJ/$cm^2$ in the image plane.

TABLE 2 summarizes the calculated throughput for various operating configurations.

| Proj. Lens Reduction | Feature Resin | Thruput for 18 × 24 in. Panels (Panels/hr) No. of DMDs | | |
|---|---|---|---|---|
| Ratio | (μm) | 1 | 2 | 4 |
| 1 | 14 | 40 | 80 | 160 |
| 14 | 1 | 2.5 | 5 | 10 |

It is assumed that the scan speed of the stage is set such that twenty pulses expose each pixel for the set repetition rate of the laser. For example, with 1:1 magnification, the XeF excimer laser would be used, with the energy density per pulse at the substrate set to be approximately 10 mJ/cm$^2$, and the image area approximately 1.5×1.5 cm. Thus, the DMD must scan the image across its width after 20 pulses (see FIG. 4), and assuming operation at 1 kHz, as described in the previous section, the scan speed is thus 0.05 cm/msec, or 500 mm/sec. Taking into account the overlap between adjacent scans (see FIG. 5), the throughput for 18×24 inch panels would be approximately 40 panels/hr., each panel exposed in approximately 90 seconds (of which, much of the time, 45 sec, is required for alignment and the overhead turn-around time after each scan.)

On the other extreme end, operating with 14:1 reduction, and using a 10 kHz Nd:YLF exposure source set for an energy density of 10 mJ/cm2 in the image plane, the image would be scanned across the DMD at a rate of 0.05 cm/0.1 msec, or 5000 mm/sec, in order to expose with 20 pulses per pixel. However, since the reduction ratio is 14×, the substrate would scan at a rate 14× slower than the rate at which the image moves across the DMD, or slightly over 360 mm/sec. Considering these parameters, the throughput for 18×24 inch panels would be approximately 2.5 panels/hr., each panel exposed in approximately 24 min.

For reduction ratios in between 1:1 and 14:1, the throughput would be somewhere between the two extremes discussed above. Additionally, we emphasize that with this system, using multiple magnification ratios and two laser illumination sources, the operator has the flexibility to select the best trade-off between feature definition and system throughput.

This throughput can be increased by a factor of 2 or more by using multiple DMDs. (see FIG. 7) In both cases discussed above, the throughput is limited by factors other than the laser power—in the first case, it is limited by stage speed, and in the second by the 10 kHz repetition rate of the DMD and laser. In fact, in the first case, 20% of the laser power is not utilized, and in the second case, 80% is not utilized. Furthermore, the example above assumed that the resist dosage was 200 mJ/cm$^2$. However, considering that there are many i-line resists with dosage of 30–50 mJ/cm$^2$, the output power from the laser may be even more incompletely utilized.

Under these conditions, one additional DMD would nearly double the throughput, two additional DMDs would triple it, and so on. As an example, by multiplexing 4 DMDs, a system with a resolution of 14 μm will deliver a throughput of 160 18×24 in. panels/hr.

While additional DMDs would call for larger field sizes for the projection lenses as well as additional illumination system optics, thereby increasing the complexity of the optical design and adding cost to the system, the increase would be less than linear in proportion to the throughput enhancement due to efficient DMD multiplexing. Further, each system could be designed on an individual basis to achieve the best trade-off between throughput and system cost. It is likely that the marginal cost for doubling or even tripling the throughput by adding one or two additional DMDs would be worth the additional system cost for most high-volume production environments.

General Considerations Regarding Processing Methods

The versatile maskless patterning system can be used to perform three different processing methods. In method #1, the system is used to pattern a wide variety of feature sizes on a wide variety of substrate materials. For method #2, the system is used to sequentially pattern the different layers comprising a single multi-layer package. Finally, for method #3, the system is used to pattern different regions on a single layer with different resolution and feature size. A preferred manufacturing process might use a single one of these methods or several of these methods in combination.

Method #1 is described as follows. Here the versatile maskless system is being used to pattern several different types of substrate materials in consecutive low-volume production runs. Each substrate material corresponds to a different type of microelectronics packaging product and has different desired feature size and exposure throughput. For each low-volume run, the appropriate projection lens and illumination source is chosen to provide optimization of the combination of the imaging resolution and exposure throughput for each substrate material. The turret mounting and focus pre-alignment of the projection lenses makes rapid changing of the lens possible. For each production run, the substrates can be either coated with photoresist for a stand photolithographic pattering process or be uncoated and directly patterned by photoablation. Each substrate is then mounted on the planar scanning stage and aligned with regard to the projected image of the spatial light modulator. The stage is then scanned while the spatial light modulator displays a sequence of frames, each frame representing a portion of the desired entire printed pattern on the substrate. Once the entire substrate is patterned, it is removed from the scanning stage and sent on to the next step in the manufacturing process. The next substrate is then mounted and the process repeated until the production run is completed.

Advantages of the versatile maskless system for method #1 are that a single system is capable of patterning a large variety of feature sizes in a wide variety of substrate materials, that the substrate size is limited only by the travel range of the scanning stage, and that selection of the projection lens and illumination source can be accomplished easily and rapidly so that system down time between production runs is minimized.

Method #2 is described as follows. Here the versatile maskless system is being used to sequentially pattern the different layers comprising a single multi-layer microelectronic packaging product in a low-volume production run. Each layer has a different desired feature size and exposure throughput. Some layers in the same package might be patterned by photolithograpy and some by photoablation. For each layer, the appropriate projection lens and illumination source is chosen to provide optimization of the combination of the imaging resolution and exposure throughput. Again, the turret mounting and focus pre-alignment of the projection lenses makes rapid changing of the lens possible. Each substrate containing the layer of interest is then mounted on the planar scanning stage, aligned, and the stage is scanned while the spatial light modulator displays a sequence of frames. Once the layer is patterned, the corresponding substrate is removed from the scanning stage and sent on the next steps in the manufacturing process that will add new layers to be patterned. For photolithographic patterning, the patterned photoresist would be developed, the underlying material etched, the remaining photoresist stripped, a planarizing layer deposited, a new layer of material to be patterned deposited on top of that, followed by a new layer of photoresist. For photoablative patterning, a planarizing layer would be directly deposited and a new layer of material to be patterned deposited on top of that. The substrate would then be returned to the versatile maskless system for patterning of the new layer. Once all of the layers in all of the substrates are patterned, the production run is completed.

Advantages of the versatile maskless system for method #2 are that a single system is capable of patterning a large variety of feature sizes that are necessary for each layer of a multi-layer package, that the substrate size is limited only by the travel range of the scanning stage, and that selection of the projection lens and illumination source can be accomplished easily and rapidly so that system down time between processing each layer is minimized.

Method #3 is described as follows. Here the virtual maskless system is being used to pattern different regions on a single layer of a microelectronic packaging product. Each region has a different optimum combination of feature size and exposure throughput. The software that controls the system and provides the frame data to the spatial light modulator is given the additional capability of recognizing those regions of the virtual mask that require different feature sizes. The appropriate projection lens and illumination source are selected for a particular feature size and the planar scanning stage is scanned to cover only those regions on the substrate that correspond to that feature size. This is repeated for all of the different regions that make up the layer. The substrate remains fixed on the scanning stage throughout this process. In this way the high detail areas are patterned slowly with the necessary high resolution while the other areas on the substrate can be patterned more rapidly at lower resolution. The slow high resolution scan skips over those areas of the substrate where there are no high resolution features, greatly reducing the time necessary to do the entire high resolution scan.

Advantages of the versatile maskless system for method #3 are that a single system is capable of patterning a large variety of feature sizes that are necessary for each region of a layer of a microelectronic packaging product, that the substrate size is limited only by the travel range of the scanning stage, and that selection of the projection lens and illumination source can be accomplished easily and rapidly so that system down time between processing each region is minimized.

General Considerations Regarding Product Design

In order to take fuller advantage of the ability to pattern different regions of the substrate with different feature sizes, it is possible to design the virtual mask for each layer in such a manner that the small features are deliberately clustered in specific regions of the substrate. In this way the fractional area of the substrate with high detail that requires slow, high resolution patterning is minimized and the patterning system throughput is enhanced as the high resolution scan can skip over a large majority of the area of the substrate.

The invention claimed is:

1. A method of optimized patterning of feature micropatterns on substrates for projection optical patterning using a plurality of differing projection means, including at least first and second projection means, addressing substrates at a patterning work station, in the following steps:

Step 1. Calculating optimum resolution/sequence/position protocols for a given substrate to be presented at such patterning work station, in a sequence including a plurality of substrates to be appropriately patterned with features;

Step 2. Positioning such given substrate on a precision positioner for presentation to such patterning work station for pattern scanning;

Step 3. Pattern scanning such given substrate for features requiring a first resolution, by a first-resolution protocol providing scanning motion to such given substrate with respect to a patterning beam from said first projection means with parameters corresponding to said first resolution; and Step 4. Patterning such given substrate for features requiring a second resolution, by a second-resolution protocol providing scanning motion to such given substrate with respect to a patterning beam from second projection means with parameters corresponding to said second resolution;

whereby the processing of patterning of such given substrate is optimizable for system throughput by such protocols for such parameters as total patterning time duration and use of equipment, with tradeoffs of processing time duration optimization such as accepting for certain features less-than-highest resolution protocol for features not demanding highest resolution, while providing required higher resolution for all features patterned by a higher-resolution protocol.

2. The method according to claim 1, further characterized in that

Step 4, in addition to:

Patterning such given substrate for features requiring a second resolution, by providing scanning motion to such given substrate with respect to a patterning beam with resolution corresponding to said second resolution; includes:

Controlling the scanning motion during the step to provide for skipping regions assigned for patterning in a different step;

whereby low resolution features may be quickly patterned by high fluence imaging at high speed over the required positions on the substrate which may be patterned satisfactorily at low resolution in a high-speed scan, and time may be saved on scans for features demanding higher resolution, which may be carried out quickly by skipping at high speed over a substrate region assigned for patterning by a lower-resolution protocol which addresses the and much larger pixels make it possible to complete the scan in much less time than required for the small pixel scan required for a higher resolution feature of similar substrate area.

3. The method of claim 2, further characterized in that the substrates in the sequence are each optimizable for patterning by a single full-coverage scan at a selected patterning image size and a single feature resolution, but the selection of patterning image size may change from substrate-to-substrate in the sequence, and thus require a change to a different protocol for any substrate in a sequence, and there is a finite duration of non-imaging time as a patterned substrate is removed and another substrate is positioned at the patterning work station, and there is a single patterning beam giving pixel values for pattern imaging of an imaging region, and there are plural projection means providing plural pixel sizes but requiring a finite time duration for change among such projection means, the time duration of the substrate change interval is non-imaging time, and the time duration for change from one projection means to another is also non-imaging time; and the method includes starting the projection means change during the substrate change interval to optimize throughput.

4. A method of optimized patterning of a feature micropattern on a substrate, for a set of at least one projection optical patterning scan addressing the substrate, having available at least one of a plurality of differing projection means, including at least first and second projection means, addressing such substrate at a patterning work station, in the following steps:

Step 1. Calculating a set of at least one protocol for optimum patterning scan for a given substrate presented at such patterning work station, in a sequence including a plurality of substrates to be appropriately patterned;

Step 2. Positioning such given substrate on a precision positioner for presentation to such patterning work station for pattern scanning, during a positioning interval of time;

Step 3. Positioning at such patterning station a selected projection means appropriate to said one protocol, during at least a portion of such positioning interval of time; and Step 4. Pattern scanning such given substrate according to said one protocol;

whereby the processing of patterning of such given substrate is optimizable for system throughput by said one protocol for such parameters as total patterning time duration and use of equipment, with tradeoffs of processing time duration optimization and resolution, while providing required resolution for all features.

5. The method of claim 4, further characterized in that the substrates in the sequence correspond to microelectronics packaging products each with a single layer that needs to be patterned, each type of substrate having a different type of layer to be patterned and having a desired resolution.

6. The Method of claim 5, further characterized in that the method of patterning is photolithography.

7. The method of claim 5, further characterized in that the method of patterning is photoablation.

8. The method of claim 5, further characterized in that the substrates in the sequence correspond to microelectronics packaging products each with a single layer that needs to be patterned, each type of substrate having a different type of layer to be patterned.

9. The Method of claim 5, further characterized in that the method of patterning is photolithography.

10. The method of claim 5, further characterized in that the method of patterning is photoablation.

11. The Method of claim 5, further characterized in that the substrates in the sequence correspond to microelectronics packaging products each with a single layer that needs to be patterned, each type of substrate having a different type of layer to be patterned.

12. The Method of claim 5, further characterized in that the substrates in the sequence correspond to substrates at different stages in the fabrication of a multilayer microelectronics packaging product, each with a particular layer to be patterned, each layer optimizable for patterning by a single full-coverage scan at a selected patterning image size and a single feature resolution.

13. The method of claim 12, further characterized in that the substrates in the sequence correspond to substrates at different stages in the fabrication of a multilayer microelectronics packaging product, each with a particular layer to be patterned, each layer optimizable for patterning by a single full-coverage scan at a selected patterning image size and a single feature resolution.

14. The method of claim 12, further characterized in that:

the substrates in the sequence correspond to substrates at different stages in the fabrication of a multilayer microelectronics packaging product, each with a particular layer to be patterned, each layer optimizable for patterning by a single full-coverage scan at a selected patterning image size and a single feature resolution.

15. A patterned substrate having a multiplicity of features, which features are subject to non-arbitrary consideration in classes according to resolution requirement in patterning during manufacture, including a hierarchy of low-resolution-requirement class and at least one higher-resolution-requirement class, such substrate being subject also to arbitrary consideration as a multiplicity of feature regions characterized by:

at least one low-resolution-requirement region patterned exclusively with low-resolution-requirement features;

at least one higher-resolution-requirement region patterned with features including at least one higher-resolution-requirement feature;

non-random feature placement departures from random placement and ordinary standard feature placement, increasing the occurrence of homogeneous grouping of low-resolution-requirement features with exclusivity and to increase the grouping of higher-resolution-requirement features in regions having non-random lack of lower-resolution-requirement features;

whereby a low-resolution-requirement feature located in a mixed-resolution-requirement region with higher-resolution-requirement features demonstrates higher resolution manufacture than the same feature located in a lower-resolution-requirement region, demonstrating that optimizing patterning protocols were used to provide plural pixel sizes in differing regions for overall optimization of elapsed time in patterning during manufacture of the substrate.

16. A patterned substrate made using apparatus having multiple projection means and multiple resolution protocols providing respective resolutions, by the following method steps:

Step 1. Calculating optimum resolution/sequence/position protocols for said substrate to be presented at a patterning work station, in a sequence including a plurality of substrates to be appropriately patterned with features;

Step 2. Positioning said substrate on a precision positioner for presentation to such patterning work station for scanning;

Step 3. Patterning said substrate for features requiring a first resolution, by a first-resolution protocol providing scanning motion to such given substrate with respect to a patterning beam from said first projection means with parameters corresponding to said first resolution; and Step 4. Patterning said substrate for features requiring a second resolution, by a second-resolution protocol providing scanning motion to such substrate with respect to a patterning beam from second projection means with parameters corresponding to said second resolution.

17. A patterned substrate made using apparatus having multiple projection means and multiple resolution protocols providing respective resolutions, characterized by:
at least one group of features, each feature in said group having the same level of resolution as all other features in the same group, even if a subset of at least one of said features in said group does not require such high level of resolution and such subset would ordinarily have been made by a lower level of resolution for economy of patterning, but pursuant to optimizing decision related to time duration of pattern scanning, such subset is grouped together with features demanding higher resolution for overall time duration optimization in patterning.

18. A patterned substrate made using apparatus having multiple projection means and multiple resolution protocols providing respective resolutions, characterized by:

an artificial grouping of features into regions on such substrate, such artificial grouping departing from usual grouping norms for the related class of microelectronics in placement of certain features having resolution requirements differing from other features with which such certain features are logically grouped for reasons such as data flow, space requirements, or path lengths, to achieve homogeneity of resolution by region on the substrate.

* * * * *